FREQUENCY-SELECTIVE SEMICONDUCTOR OSCILLATION DEVICE

Filed July 20, 1968 4 Sheets-Sheet 1

INVENTORS
YASUO MATSUKURA
KUNIICHI OHTA
TOSHIO WADA
BY
Hopgood & Calimafde
ATTORNEYS INVENTORS
YASUO MATSUKURA
KUNIICHI OHTA
TOSHIO WADA
BY
Hopgood & Calimafde
ATTORNEYS

FREQUENCY-SELECTIVE SEMICONDUCTOR OSCILLATION DEVICE

Filed July 20, 1968 4 Sheets-Sheet 3

INVENTORS
YASUO MATSUKURA
KUNIICHI OHTA
BY TOSHIO WADA

Hopgood & Calimafde
ATTORNEYS

INVENTORS
YASUO MATSUKURA
KUNIICHI OHTA
TOSHIO WADA
BY
Hopgood & Calimafde
ATTORNEYS United States Patent Office 3,535,601
Patented Oct. 20, 1970

3,535,601
FREQUENCY-SELECTIVE SEMICONDUCTOR OSCILLATION DEVICE

Yasuo Matsukura, Kuniichi Ohta, and Toshio Wada, Tokyo, Japan, assignors to Nippon Electric Company, Limited, Tokyo, Japan Filed July 30, 1968, Ser. No. 748,837
Claims priority, application Japan, July 31, 1967, 42/49,216; May 16, 1968, 43/33,236
Int. Cl. H01l 11/00
U.S. Cl. 317—235 9 Claims

ABSTRACT OF THE DISCLOSURE

A Gunn effect device is described for altering the frequency of high field domains therein by selectively biasing different regions of a Gunn crystal element above the oscillation sustaining threshold. Several embodiments are described. A novel method is described for pulse-frequency modulating a signal source utilizing one of the embodiments.

This invention relates to an improvement in the ultra-high frequency oscillation element of the Gunn-diode type.

The Gunn-diode oscillator is based on the oscillation phenomenon caused by the cyclic formation and disappearance of a local high electric field domain (hereinafter abbreviated to "high field domain") observed in those semiconductor crystals which exhibit a bulk negative differential conductance effects. The negative conductance is believed to be caused by the transfer of conductor electrons from lower band with a small effective mass to an upper band with a large effective mass.

Recently, techniques in the field of high speed logic elements have been developed to the extent that a control of the motion of the high field domain is feasible. In the devices so far developed, a control electrode is provided on a sample which is biased by an external D.C. source so that the internal electric field is maintained at a level lower than a threshold electric field and higher than a minimum sustaining field which is necessary to sustain a high field domain once it is generated by some means (to be called hereafter "sustaining field"). Then, by applying a triggering voltage to the diode through said control electrode a high intensity region of strong electric field is generated within a portion of said diode and it is possible to control the formation of the high field domain. One of the above-mentioned techniques is disclosed in the monthly periodical "Denshi Zairyo (Electronic Materials)," May 1967, pp. 20–24 and also in the United States Pat. No. 3,365,583 issued to I.B.M. Corp. According to these articles, the high field domain can be formed and extinguished only by changing the polarity of the voltage applied to the control electrode. Furthermore, the articles disclose that the current waveform can be changed by changing the cross-sectional areas or electron densities of the sample.

As an ultra-high-frequency oscillation device, semiconductor elements utilizing the formation of the high field domain are superior to the conventional p-n junction element, Schottky diode and the like, in view of their reduced noise level and increased operational speed and output power. However, for various reasons, such as that suitable maetrials are not available, and that the devices are not easily manufactured, the novel device has not been put into practical use Furthermore, the effect attributable to the means for practically generating the high field domain has not yet been clarified. In case of the novel device obtained by the improvements in the Gunn-diode, only the oscillation frequency and the repetition frequency of the pulse output inherent to the structure of the element are obtained. Under these circumstances, it has been considered impossible to widely vary for instance, provide a function generator, the oscillation frequency and the repetition frequency of the output pulse.

It is therefore a prime object of the present invention to provide a semiconductor device in which the frequency of the Gunn-diode type oscillation can be varied by varying the motion of the high field domain.

Another object of the present invention is to provide a semi-conductor switching device in which the life time of the high field domain can be changed by means of external circuitry.

Figure 3:
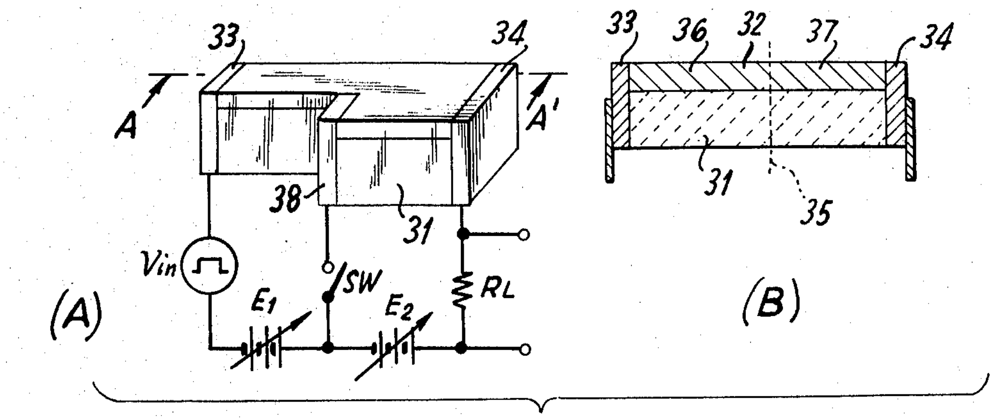
Figure 5:
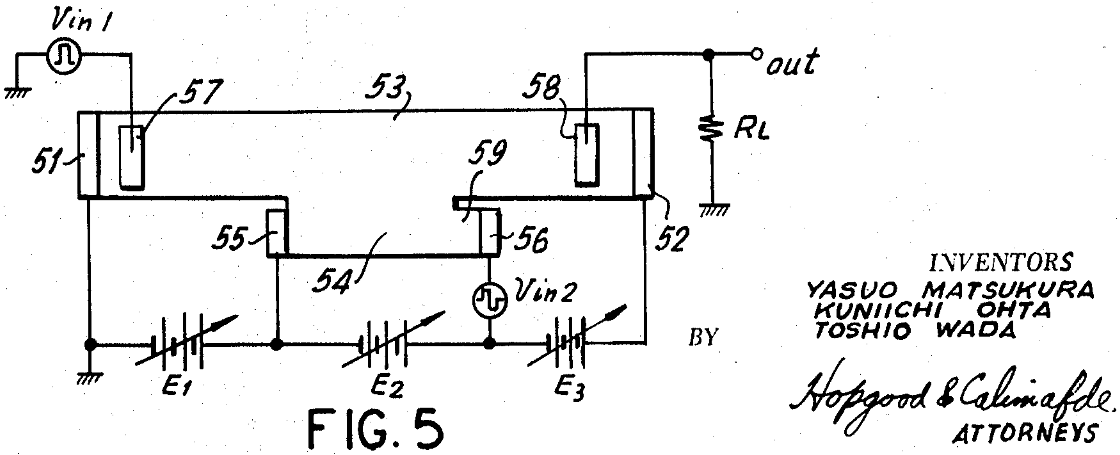
Figure 7:
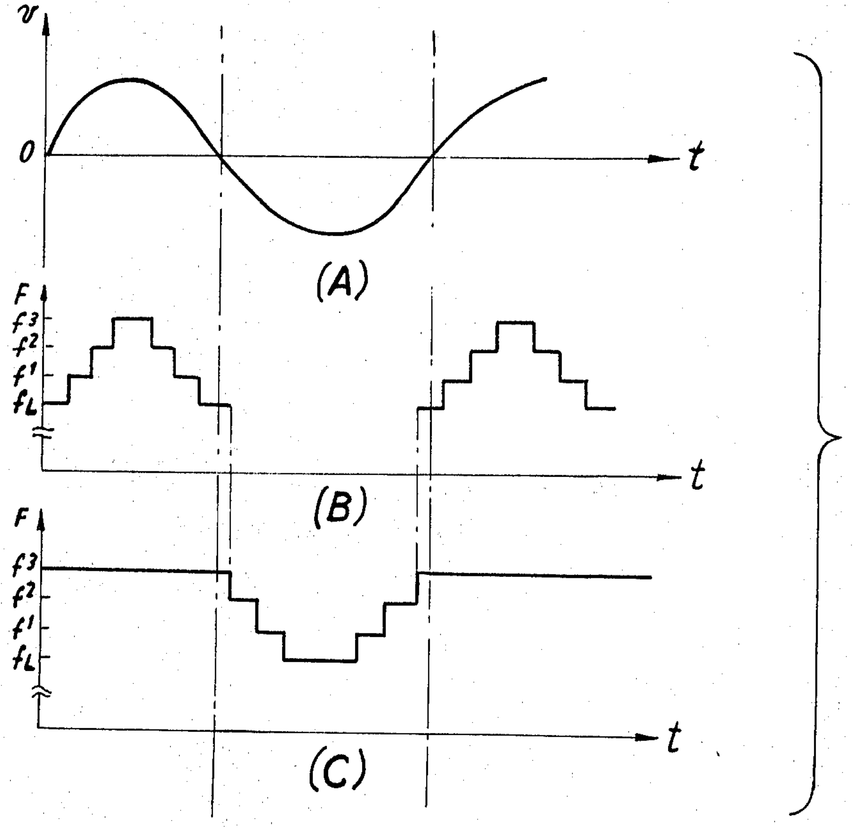

FIGS. 3(A) and (B) are a perspective view and a longitudinal cross-sectional view of a second embodiment of this invention, respectively;

FIGS. 4(A) through (F) are graphs showing input and output waveforms of the second embodiment;

FIG. 5 is a plan view of a third embodiment of this invention;

FIGS. 6(A) and (B) illustrate a fourth embodiment of this invention;

FIGS. 7(A) through (C) are waveforms for describing the fourth embodiment;

FIG. 8(A) shows a fifth embodiment of this invention;

FIG. 8(B) shows a waveform for describing the fifth embodiment; and

Figure 9:
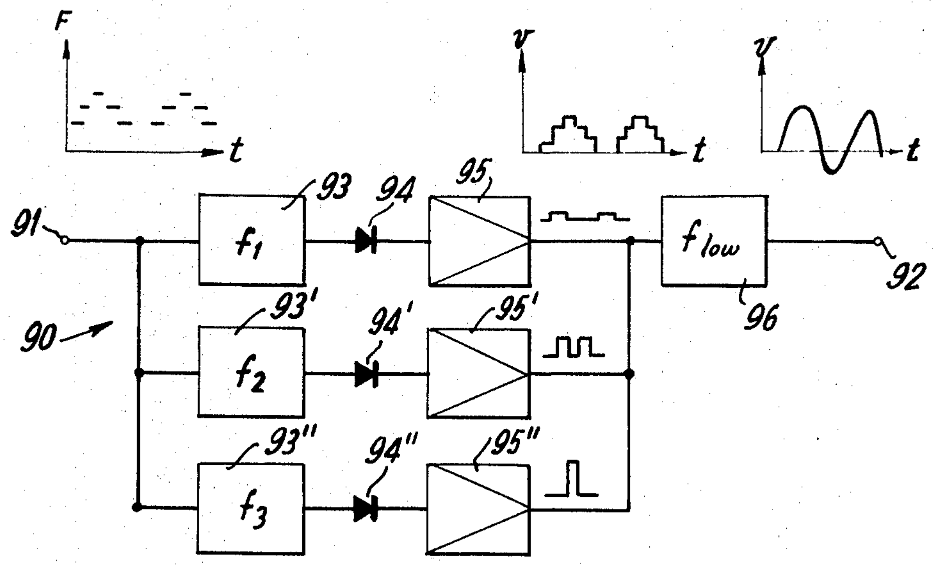

FIG. 9 is a block diagram of means for processing the output of the fourth and fifth embodiments.

According to this invention, there is provided a semiconductor device which comprises a Gunn element having two crystal regions mutually different in cross sectional areas or in carrier densities between anode and cathode electrodes attached to both ends of the element, and means for triggering each of the regions selectively above the threshold electric field intensity.

The internal electric field of each of the regions is different from each other at a given bias voltage. Upon varying the bias voltage, the electric field of each region is changed keeping the relative ratio of each field constant. Thus it is possible to change the oscillation frequency and to obtain a pulse waveform of a different pulse width by controlling the region in which the high field domain is generated.

With reference to the accompanying drawing, the present invention will be described in detail so that the features of the invention may be well understood.

The reason why the high field domain known as a Gunn effect is generated is that the conduction band of the gallium-arsenic crystal has a minimum with small effective mass as well as subminima with large effective mass and higher energy, and that the electrons are accelerated by the high electric field so that a redistribution of the electrons in the upper and lower minima takes place. The mechanism of the Gunn effect is described in "Theory of Negative Conductance Amplification and of Gunn Instabilities in Two Valley Semiconductors," IEEE Trans. Electron Devices, vol. ED–13, pp. 4–21, January 1966, by D. E. McCamber and A. G. Chynoweth. More particularly, when the electrons are accelerated by the high electric field to become "hot" the average velocity becomes strongly dependent on the electric field due to the strong dependence of the electron temperature on the electric fields and an increase in the electric field intensity causes the number of electrons in the upper subbands of large effective mass to become larger, resulting in the appearance of an electric field region exhibiting a negative differential conductivity. As a result, a local high field domain appears under certain proper conditions and propagates in the crystal until it disappears.

The mechanism of a Gunn effect in the gallium arsenide crystal entirely originates with the behavior of such a high field domain. When a high electric field is impressed on a gallium arsenide crystal of a rectangular solid form, there is a relation between the excess domain voltage $Vd$ and the electric field $Fl$ in the low electric field part such that $$Vd=V-Fl1$$

where V is the impressed voltage across the sample and $l$ is the length of the sample. On the other hand, there is a unique relation for the gallium arsenide crystal between $Vd$ and $Fl$ which is determined only by the specific resistance.

Figures 1, 2:
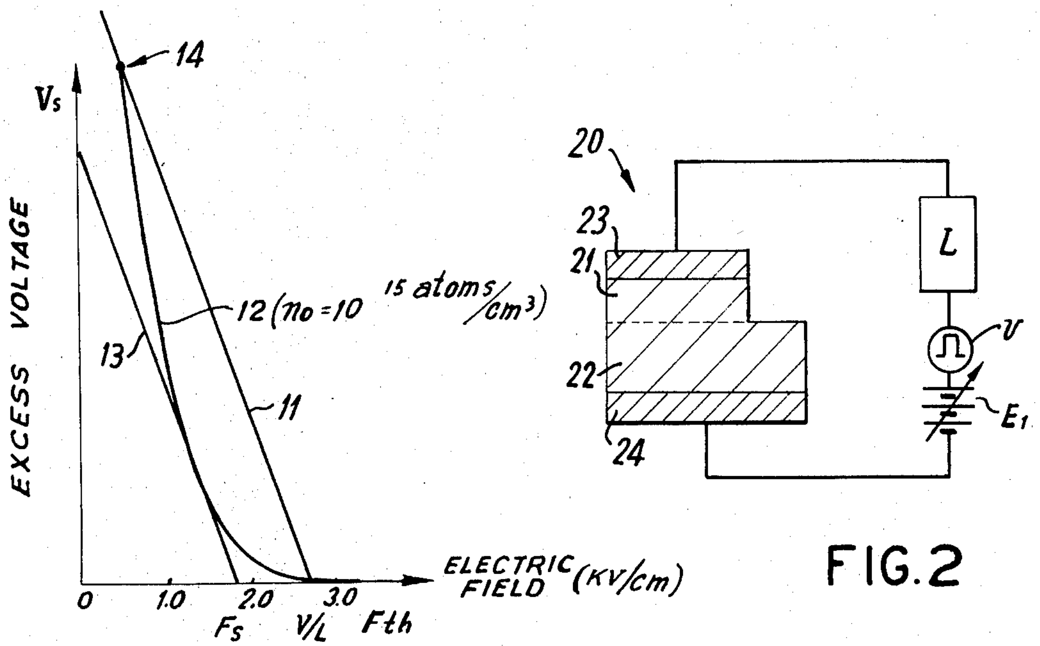
FIG. 1 is a diagram illustrating the generation of an electric dipoel layer of high electric field.
FIG. 2 is a longitudinal cross-sectional view of the first embodiment of this invention.

Referring to FIG. 1 which plots the low electric field $Fl$ on the abscissa and the excess domain voltage $Vd$ on the ordinate, the relation between the electric field inherent to the specific resistance and the domain voltage is shown by Curve 12 and the domain voltage $Vd$ is plotted against the applied voltage to the crystal V as indicated by the load line 11. Curve 12 has a threshold value $Fth$ for generating the high field domain at $Vd=0$. If the applied electric field is larger than the threshold value $Fth$, the generation and disappearance of the high field domain in the vicinity of the cathode and its disappearance at the anode are repeated so that oscillation in the microwave frequency region is obtained. The load line 13 tangential to the Curve 12 indicates the minimum value of $Vd$ or $Fl$ (which is designated as $Vs$ and $Fs$ respectively in FIG. 1) needed for sustaining the high field domain once it is generated in the crystal and the applied voltage at that time shows the minimum sustaining electric field $Fs$. Therefore, when the impressed voltage V is applied so as to establish an inner electric field $V/L$ of a value between the minimum sustaining electric field $Fs$ and the threshold value $Fth$, the crystal does not generate the high field domain but, by applying further a triggering electric field from an external circuit, the inner electric field is raised beyond the threshold electric field $Fth$ and a high field domain is generated. The response time under this condition is very short corresponding to the growth time for the high field domain, and is in the order of from $10^{-11}$ to $10^{-12}$ sec. Conversely, when the electric field of a region near the high field domain is lowered below the sustaining electric field $Fs$ by applying an triggering voltage in the opposite direction from an external circuit, it is possible to extinguish the high field domain. The cross point 14 of the curve 12 and the load line 11 shows the excess domain voltage and the electric field intensity in the operational state as expressed by the foregoing equation.

Referring to FIG. 2, the apparatus of the first embodiment of this invention consists of a Gunn element 20 having two semiconductor regions 21 and 22 of n-type conductivity and which have mutually different cross-sectional areas between an anode 23 and a cathode 24 which are in ohmic contact with the ends of the element. A load L; a triggering pulse source V; and a biasing power source $E_0$ are serially connected to the load and the trigger source. The first region 21 of the Gunn element 20 is a parallelpiped of gallium arsenide (Ga As) single crystal is 25$\mu$ in thickness with a cross sectional area of $50\times40\mu^2$ and has a doping concentration of $3\times10^{15}$ atoms/cm$^3$. The second region 22 is formed of the same material as the region 21 and is 55$\mu$ in thickness and $50\times60\mu^2$ in its cross-sectional area. Electrodes 23 and 24 are formed in ohmic contact with the surfaces of the first and second regions 21 and 22. Beneath these electrodes, highly doped regions may be formed.

In the circuit shown in FIG. 2, the bias voltage across the electrodes 23 and 24 becomes approximately 23 volts in the absence of the triggering pulse from the source V. Then, the first semiconductor region 21 is driven into the oscillation state so that the high frequency pulse signals having a repetition period of approximately 0.25 nanosecond are fed into the load L. When the potential across the electrodes is raised to approximately 32 volts by the trigger source V, the repetition period of the high frequency signals obtained at the load L is remarkably increased to the order of 0.75 nanosecond. It is therefore to be understood that both of the first and second regions have been driven into the oscillation state. The switching between the above mentioned two oscillation states can be made in a very short time within this Gunn semiconductor element 20, because the high frequency signals are obtained by the propagation of the high-field domain within the semiconductor element.

The semiconductor element 20 of the first embodiment can be utilized as a pulse generator with different pulse widths which are controllable by the bias voltage. Also, it may be used as a solid state modulator producing high frequency signals whose frequency is varied in response to the level of the AC signal superposed on the bias voltage.

Referring to FIGS. 3(A) and (B), the second embodiment of this invention comprises a GaAs epitaxial layer 32, which is 15$\mu$ thick, 500$\mu$ long, and 50$\mu$ wide, in a first region 36 on the cathode side. Layer 32 has a width of 100$\mu$ in a second region 37 on the anode side. The epitaxial layer 32 contains tellurium impurity of about $10^{15}$ atoms/cm.$^3$ as an n-type dopant and is fabricated on the highly insulative GaAs substrate 31, which has a specific resistance of several hundred kiloohm-cm. The element has electrodes 33 and 34 at both ends of the epitaxial layer 32 for providing a cathode and an anode electrode for the element. This element has a boundary surface 35 spaced apart from the cathode by 300$\mu$. The boundary surface 35 divides the element into the region 36 on the cathode side and the region 37 on the anode side. An intermediate electrode 38 is in ohmic contact with the boundary surface 35.

Each electrode of this element is coupled to a triggering voltage source $v_{in}$, DC sources $E_1$ and $E_2$, a load $R_L$, and a switch SW for the intermediate electrode, as shown in FIG. 3(A).

A characteristic phenomenon can be observed when the electric field intensity in the regions 36 and 37 are adjusted to a value between the sustaining electric field $Fs$ and the threshold electric field $Fth$ by applying a triggering pulse through the intermediate electrode 38, as will be discussed in more detail hereinafter.

Referring now to FIGS. 3(A) and (B) and referring to FIGS. 4(A) to (F), when a square or a rectangular pulse voltage of the order of approximately −40 v. (FIG. 4(A)) is applied to the cathode from the trigger voltage source $V_m$, a DC voltage of the order of approximately 95 v. is applied across the element as long as the intermediate electrode 33 is disconnected. As a result, the internal electric field in the region 36 produces a high field domain within a period when said internal electric field is applied, and this high field domain vanishes at the boundary surface 35. Thus, the output pulse has a width (FIG. 4B) which is determined by the velocity of the high field domain and the length of the first region 36. The internal electric field within the region 36 is established by the source E, by closing the switch SW. With switch SW closed, both of the electric field intensities within the regions 36 and 37 are maintained below the threshold field $Fth$ but higher than the sustaining field $Fs$. Then by triggering $V_{in}$ an output pulse having a pulse width $t_2$ FIG. 4(C) can be obtained. In this case, $t_2$ is the time required for the high field domain to move through both regions 36 and 37.

Figure 4:
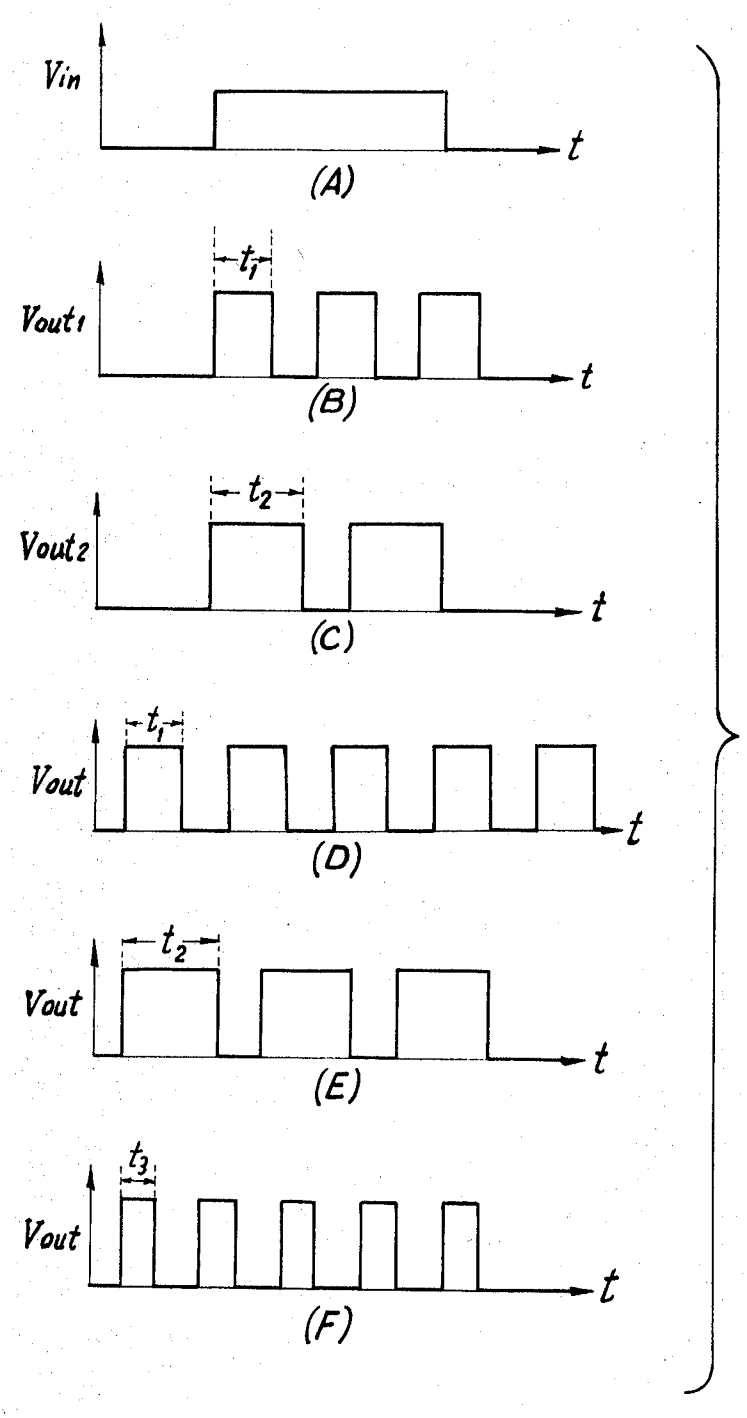

Moreover it is possible to repeatedly generate the high field domain by suitably adjusting the electric field intensities in the regions 36 and 37 supplied from the power sources $E_1$ and $E_2$ independently of the trigger potential $V_{in}$. FIGS. 4(D), (E) and (F) show respectively the waveforms of the output pulses of the case where the electric field in the region 36 is higher than the threshold intensity while the electric field in the region 37 is less than the sustaining electric field; the case where the electric field intensity in the region 36 is higher than the threshold value while the field in the region 37 equal to the sustaining field; and the case where the intensity of the electric field in the region 36 is less than the threshold value while the field in the region 37 is higher than the treshold value. The pulse widths $t_1$, $t_2$ and $t_3$ shown in FIG. 4 are obtained approximately by dividing the distances over which the layer travels by the drift velocity of the high field domain. The velocity of the domain is of the order of $10^7$ cm./sec., so that in the element we obtain $t_1=3$ ns., $t_2=5$ ns. and $t_3=2$ ns., respectively.

When the element is in the oscillation state, the frequencies are $f_1=0.3$ gc., $f_2=0.2$ gc. and $f_3=0.5$ gc. respectively, all of which can be observed when the output waves are heterodyne-detected by means of a standard oscillator.

Next, referring to FIG. 5, the third embodiment of the invention has a distance between the cathode 51 and the anode 52 of 500$\mu$. On the other hand, the width of the semiconductor crystal is 100$\mu$ and an L-shaped branch 54 is formed at the central portion of the main conduction path 53. At both ends of the branch 54 are provided intermediate electrodes 55 and 56, respectively. In forming the branch 54, the deleted part of the epitaxial layer can be removed by suitable chemical-etching so that the width of the branch 54 may become 50 microns. In the case of this embodiment, a silicon oxide layer is further formed on the epitaxial layer, and furthermore, an aluminum film is deposited upon the silicon oxide layer selectively so as to provide an input electrode 57 and an output electrode 58.

The electric field intensity within the semiconductor crystal is maintained at a value lower than the threshold value but higher than the sustaining field by means of DC sources $E_1$, $E_2$ and $E_3$. The high field domain can be generated when the electric field intensity between the cathode 51 and the input electrode 57 becomes higher than the threshold field by an input trigger supplied from the input source $V_{in1}$. When the electric field in the middle portion is higher than the sustaining value, the high field domain is transferred toward the anode without being subjected to any interruption. When the domain is passing immediately beneath the output electrode 58, the potential of the output electrode is lowered, with the result that an output pulse can be obtained across a load $R_L$. This output pulse width is equal to the value obtained by dividing the width of the output electrode by the drift velocity of the high electric field domain. For this reason, the output pulse has an extremely short width.

On the other hand, when a portion of the high electric field domain reaches the intermediate electrode 56 at the L-shaped branch 54, it vanishes. In such case, the magnitude of said portion of the high electric field domain is determined by field intensities in the branch end portion 59 and in the main conduction path 53 and by the cross-sectional areas or the carrier densities. For instance, if the average electric field of the main conduction path 53 is 1.6 kv./cm., and the electric field in the branch end 59 is 1.6 kv./cm., then if the electric fields in the branch 54 and the branch end 59 are increased by 1.5 kv./cm. by means of an electric power source $v_{in2}$ connected to the intermediate electrode 56, the high electric field domain generated at the cathode will reach only the intermediate electrode 56. The effect of the power source $v_{in2}$ then lowers the electric field in the main conduction path between the middle portion and the anode so that no output pulse can be obtained. Conversely, when the intensity of the electric field at the middle portion is lowered, the high electric field domain can be extinguished at the middle portion of the main conduction path 53 and such reduction of the voltage applied across the intermediate electrodes 55 and 56 can be accomplished by reducing the voltage supplied from the source $E_2$ or by supplying a negative voltage having an effect of $-1.5$ kv./ohm from the source $v_{in2}$ to the intermediate electrodes. Therefore, when a high speed pulse source is used as the source $v_{in2}$, the number of the high field domains generated in the vicinity of the cathode to the number of the output pulses can be selected in any suitable manner, whereby the repetition frequency of the output pulse can be varied.

Referring to FIGS. 6(A) and (B), a fourth embodiment 60 of the present invention has a major semiconductor region 63 with a length of 96 microns and a width of 10$\mu$ interposed between a cathode 61 and an anode 62. The region 63 serves as a propagating path for the high-field domain, and a stepped semiconductor region 64 has its width enlarged by 1$\mu$ at every 1$\mu$ of its length $l_1$. An n-type GaAs layer 66 is epitaxially grown in liquid phase or gas phase upon a highly insulative substrate 65 of semiconductor single crystal, such as GaAs and germanium (Ge), with a thickness of 5$\mu$, the impurity concentration of the layer 66 being $3\times10^{14}$ atoms/cm.$^3$. At both ends of this n-type GaAs layer 66 are formed the cathode 61 and the anode 62 respectively by highly doped n-type regions 61' and metal electrodes 61'' and 62'', respectively. Thereafter, the semiconductor element thus fabricated is subjected to etching to a predetermined size. The semiconductor element 60 thus obtained is further provided with an output electrode 68 made of aluminum or tin which is disposed on a thin dielectric layer 67 such as silicon oxide or barium titanate upon the major semiconductor region 63 to form the oscillation output terminal.

In the Gunn-effect element as described above, the ratio of the cross sectional area of the major Gunn-effect region 63 to the three-stepped Gunn-effect region 64 is equal to the ratio of the electric field intensity in the region 63 to that in the region 64; that is 5:6:7:8. Therefore, when the major Gunn-effect region 63 is put into oscillation by a DC bias power source $E_o$ and the input signal $v=v_{\sin}\omega t$ from an input source $v$ is superposed upon this DC bias source, the electric fields within the Gunn-effect regions 63 and 64 are varied with time, so that the distance of the propagation of the high-field domain is varied stepwise. Therefore, the oscillation frequencies appearing at the output terminal 69 are four specific frequencies which are switched from one another. Depending upon the characteristic of the Gunn-effect element, these specific frequencies are respectively 1.03 gHz, 1.02 gHz, 1.01 gHz and 1.00 gHz. and are switched at high speed in response to the potential applied, which determines the electric field intensity within the semiconductor device. Furthermore, these specific frequencies can be distributed at a suitable interval by changing the distance of the propagating path of the high field domain, with the ratio of the cross sectional areas of the stepped portions being maintained constant.

Referring to FIGS. 7(A) to (C), it will be understood that when the input signal is a sinusoidal wave as shown in FIG. 7(A), the oscillation at specific frequencies $f_L$, and $f_1$ to $f_3$ or $f_3$ to $f_1$ and $f_L$ can be produced as shown in FIGS. 7(B) and (C) at every positive or negative half-cycle of the input signal. By these discrete frequencies levels UHF frequency-shift modulation is realized without resorting to signal level quantization before modulation.

Figure 8:
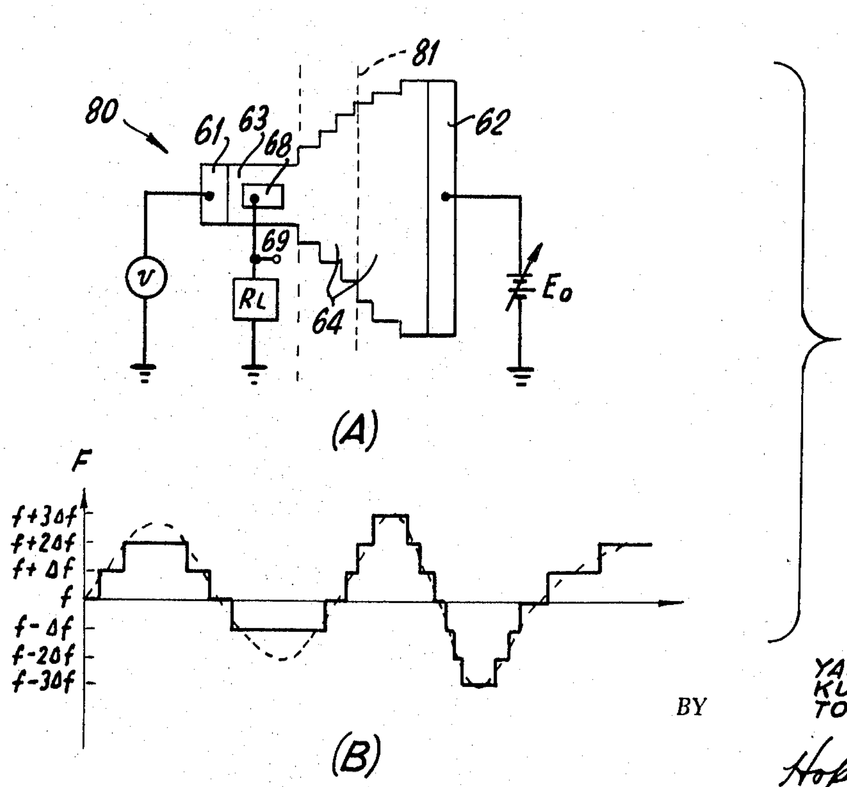

Referring to FIG. 8, a fifth embodiment of the Gunn-effect element 80 of the present invention is shown. Similar reference numerals in FIG. 8 designate the similar elements shown in FIG. 6. The stepped portions of the Gunn-effect region 64 have been increased as compared with those of the stepped Gunn-effect region shown in FIG. 6 so that the stepped portions up to the midportion 81 belong to the DC-biased oscillation region.

With the semiconductor device shown in FIG. 8, the positive or negative voltage level of the signal 82 can be quantized into specific frequencies having an increment of $\Delta f$ and the same width depending upon the length of the stepped portions as shown in FIG. 8(B).

Next, referring to FIG. 9, there is shown a block diagram of a reproduction unit for demodulating the frequency-shift-modulated waves supplied from the fourth and fifth embodiments above described. In the receiving unit, between the input terminal 91 and the output terminal 92 are interposed a demodulator generally designated 90. The demodulator 90 comprises bandpass filters 93, 93' and 93'', each for a specific frequency range; detectors 94, 94' and 94'', amplifiers 95, 95' and 95'' and a bandpass filter 96. In demodulator 90, each of the specific frequencies is respectively detected and amplified by the associated amplifier. The potential levels are then synthesized. Thus, a synthesized signal is fed into the filter 96 which resonates with the modulating signal shown in FIG. 6(A). The signal is wave-formed or shaped by the filter 96 to reproduce an accurate replica of the modulating signal.

Figure 6:
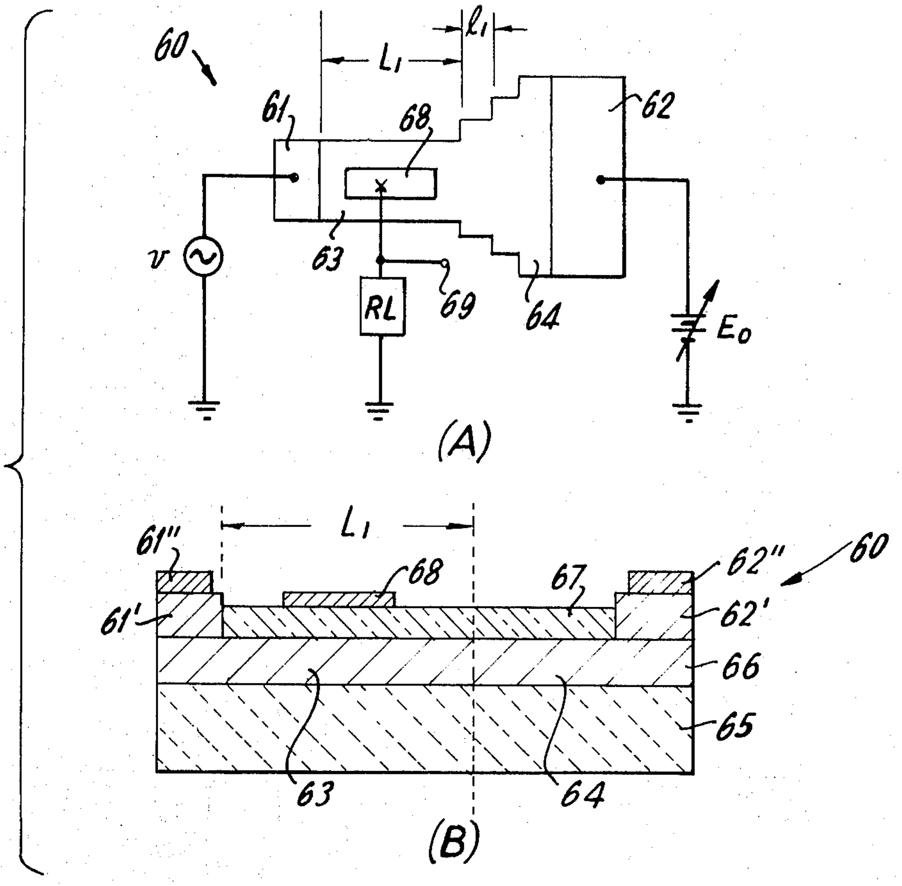

As will be understood from the foregoing, a communication system including the transmitter shown in FIG. 6 or 8 and the receiver of FIG. 9 will find an application in the field of multi-level digital transmission systems.

In the above embodiments, the resistance distribution of the stepped portions of the Gunn-effect element has been mentioned with reference to the case where the cross-sectional areas of the stepped portions are selected. A similar resistance distribution can also be provided by selecting the distribution of impurity concentration in the Gunn-effect region. Also, instead of intermediate electrodes formed between the regions of varied cross-sectional areas, they may be formed in the proximity of the boundary surface of different electron densities in a uniform specimen.

The semiconductor crystal used in the present invention is not limited to a GaAs crystal, but may be of any other semiconductor materials which produces the bulk negative resistance effect such as piezo-electric semiconductors of cadmium sulphide, or other semiconductors such as germanium and silicon having trapping centers.

Although the invention has been described with reference to several embodiments, it will be understood that various modifications are possible within the scope of the invention.

What is claimed is:

1. A variable frequency signal generating device comprising a semiconductor crystal formed of a bulk negative resistance effect material capable of forming an electric dipole layer of high electric field intensity, said crystal being shaped with generally longitudinal region of a first cross-sectional area and an intermediate larger cross-sectional area region, a first pair of cathode and anode electrodes coupled to ends of the longitudinal region, a second pair of cathode and anode electrodes coupled to ends of the intermediate region, an input electrode coupled to the crystal near the cathode electrode of the longitudinal region and an output electrode coupled to the crystal near the anode of the longitudinal region, with the cross-sectional areas of the longitudinal region and the intermediate region sized to control coupling between the output electrode and high field domain oscillations initiated by the input electrode in the longitudinal region.

2. The device as recited in claim 1 and further comprising a first voltage source applying a bias voltage across the first pair of electrodes coupled to the longitudinal regions to establish a bias electric field intensity therein to normally produce high field domain oscillations between the control and output electrode, and a variable voltage source coupled across the second pair of electrodes to vary the electric field intensity of the longitudinal region sufficiently to terminate the high field domains in the longitudinal region at the anode electrode of the intermediate region and prevent the high field domains from reaching the output electrode.

3. The device as recited in claim 2, wherein the intermediate region is L-shaped and projects from the longitudinal region to expose a first end for connecting the anode electrode thereto and expose a second end for connecting said cathode electrode thereto.

4. A frequency-selective seminconductor oscillation device comprising a semiconductor crystal of a bulk negative resistance effect material capable of forming an electric dipole layer of high electric field intensity, said crystal being formed of at least a first and a second region having cross-sectional areas varying in a stepwise manner from said first region to said second region and defining a boundary surface therebetween, first and second electrodes respectively attached in ohmic contact to said first and second regions, thereby to arrange said first and second regions in series with respect thereto, a third electrode in ohmic contact with said crystal at said boundary surface, and means operatively connected to said first, second and third electrodes and respectively effective to supply a biasing voltage and a superimposed signal voltage to said regions, whereby propagation of said dipole layer formed by the application of said biasing voltage is selectively permitted in one or both of said regions in response to said signal voltage, thereby to produce a selected one of high-frequency oscillations at mutually different frequencies across said electrodes.

5. The device as claimed in claim 4, wherein said crystal is in the shape of an elongated parallelepiped, said first and second electrodes being attached to the two extreme end surfaces thereof.

6. The device as claimed in claim 5, wherein said crystal is of a uniform thickness and of increasing widths at graduating steps from said first electrode toward said second electrode.

7. The device as claimed in claim 6, wherein said stepwise change in the width of said crystal is symmetrical with respect to the longitudinal axis of said parallelepiped.

8. The device as claimed in claim 5, wherein said first region extends substantially along the entire length of said crystal, with the rest of said length being shared substantially equally by said second region.

9. The device as claimed in claim 4, in which said signal voltage is applied to said third electrode, thereby to initiate said dipole layer in selected ones of said regions.

References Cited

UNITED STATES PATENTS 3,365,583 1/1968 Gunn ---------------- 317—234
3,377,566 4/1968 Lanza ---------------- 317—234

FOREIGN PATENTS 1,092,448 11/1967 Great Britain.

OTHER REFERENCES

Proceedings of the IEEE, "Bulk Semiconductor High-Speed Current Waveform Generator" by Shoji, May 1967, pp. 720–721.

JERRY D. CRAIG, Primary Examiner

U.S. Cl. X.R.

331—107